(12) United States Patent
Chang et al.

(10) Patent No.: US 6,459,303 B1
(45) Date of Patent: *Oct. 1, 2002

(54) HIGH SPEED PROGRAMMABLE ADDRESS DECODER

(75) Inventors: Wanli Chang, Saratoga; David Jefferson, San Jose, both of CA (US)

(73) Assignee: Altera Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/829,499

(22) Filed: Apr. 9, 2001

Related U.S. Application Data

(62) Division of application No. 09/494,186, filed on Jan. 28, 2000.
(60) Provisional application No. 60/117,827, filed on Jan. 29, 1999.

(51) Int. Cl.[7] .................. H03K 19/082; H03K 19/094
(52) U.S. Cl. .................. 326/105; 326/40; 326/106; 326/113; 365/230.06
(58) Field of Search ................ 326/40, 105, 106, 326/113; 365/230.06

(56) References Cited

U.S. PATENT DOCUMENTS

| | | | |
|---|---|---|---|
| 4,293,783 A | | 10/1981 | Patil |
| 4,642,798 A | * | 2/1987 | Rao ............... 365/185.23 |
| 4,825,414 A | | 4/1989 | Kawata |
| 4,855,958 A | | 8/1989 | Ikeda |
| 4,963,770 A | | 10/1990 | Keida |
| 4,975,601 A | | 12/1990 | Steele |
| 5,042,004 A | | 8/1991 | Agrawal et al. |
| 5,122,685 A | | 6/1992 | Chan et al. |
| RE34,444 E | | 11/1993 | Kaplinsky |
| 5,313,119 A | | 5/1994 | Cooke et al. |
| 5,315,178 A | | 5/1994 | Snider |
| 5,329,460 A | | 7/1994 | Agrawal et al. |

(List continued on next page.)

FOREIGN PATENT DOCUMENTS

| | | | |
|---|---|---|---|
| EP | 0081917 | | 8/1983 |
| EP | 0410759 A2 | | 1/1991 |
| EP | 0415542 A2 | | 3/1991 |
| EP | 0420389 A1 | | 4/1991 |
| EP | 0507507 A2 | | 10/1992 |
| EP | 0530985 A2 | | 3/1993 |
| EP | 0569137 A2 | | 11/1993 |
| EP | 0746102 A2 | | 4/1996 |
| JP | 01091525 A | | 4/1989 |
| JP | 01091526 A | | 4/1989 |
| JP | 54136239 A | * 10/1989 | ............... 326/105 |
| WO | WO 94/10754 | | 5/1994 |

OTHER PUBLICATIONS

Masumoto, Rodney T., "Configuration On–Chip RAM Incorporated into High Speed Logic Array," IEEE Custom Integrated Circuits Conference, Jun. 1985, CH2157–6/85/0000–0240, pp. 240–243.

(List continued on next page.)

Primary Examiner—Thien M. Le
Assistant Examiner—Steven S. Paik
(74) Attorney, Agent, or Firm—Townsend and Townsend and Crew LLP; Steven J. Cahill

(57) ABSTRACT

A high-performance address decoder circuit provides higher speed read and write access for an embedded memory of a programmable logic integrated circuit. The address decoder is programmable to allow addressing of the memory in different data widths and depths. The circuitry can be used as column address decoder or row address decoder, or both. In a dual-port memory implementation of the memory, there can be two instances of each of the decoders, one for writing and one for reading.

39 Claims, 9 Drawing Sheets

U.S. PATENT DOCUMENTS

| | | | |
|---|---|---|---|
| 5,343,406 | A | 8/1994 | Freeman et al. |
| 5,352,940 | A | 10/1994 | Watson |
| 5,408,434 | A | 4/1995 | Stansfield |
| 5,414,377 | A | 5/1995 | Freidin |
| 5,426,378 | A | 6/1995 | Ong |
| 5,550,782 | A | 8/1996 | Cliff et al. |
| 5,559,450 | A | 9/1996 | Ngai et al. |
| 5,566,123 | A | 10/1996 | Freidin et al. |
| 5,668,771 | A | 9/1997 | Cliff et al. |
| 5,705,938 | A | 1/1998 | Kean |
| 5,717,901 | A | 2/1998 | Sung et al. |
| 5,744,980 | A | 4/1998 | McGowan et al. |
| 5,777,489 | A | 7/1998 | Barbier et al. |
| 5,801,547 | A | 9/1998 | Kean |
| 5,802,001 | A * | 9/1998 | Kim ........................... 365/201 |
| 5,809,281 | A | 9/1998 | Steele et al. |
| 5,821,772 | A | 10/1998 | Ong et al. |
| 5,835,405 | A | 11/1998 | Tsui et al. |
| 6,130,854 | A | 10/2000 | Gould et al. |
| 6,262,933 | B1 * | 7/2001 | Chang et al. .......... 365/230.06 |

OTHER PUBLICATIONS

Landry, Steve, "Application –Specific ICs, Relying on RAM, Implement Almost any Logic Function," Electronic Design, Oct. 31, 1985, pp. 123–130.

Bursky, Dave, "Shrink System with One–Chip Decoder, EPROM, and RAM," Electronic Design, Jul. 28, 1988, pp. 91–94.

Kawana, Keiichi et al., "An Efficient Logic Block Interconnect Architecture for User–Reprogrammable Gate Array," IEEE 1990 Custom Integrated Circuits Conf., May 1990, CH2860–5/90/0000–0164, pp. 31.3.1 to 31.3.4.

Shubat, Alexander et al., "A Family of User–programmable Peripherals with a Functional Unit Architecture," IEEE Jor. of Solid–State Circuits, vol. 27, No. 4, Apr. 1992, 0018–9200/92$03.00, pp. 515–529.

"AT&T's Orthogonal ORCA Target the FPGA Future," 8029 Electronic Engineering, 64, No. 786, Jun. 1992, pp. 9–10.

Bursky, Dave, "FPGA Advances Cut Delays, Add Flexibility," 2328 Electronic Design, 40, No. 20, Oct. 1, 1992, pp. 35–43.

Smith, Daniel, "Intel's FLEXlogic FPGA Architecture," IEEE 1063–6390/93, 1993 pp. 378–384.

Bursky, Dave, "Denser, Faster FPGAs Vie for Gate–Array Applications," 2328 Electronic Design, 41, No. 11, May 27, 1993, pp. 55–75.

Ngai, Kai–Kit Tony, "An SRAM–Programmable Field–Reconfigurable Memory," Presentation at University of Toronto, Canada, Jun. 1993, pp. 1–14.

Kautz, "Cellular Logic in Memory Arrays," IEEE Trans. on Computers, vol. C–18, No. 8, Aug. 1969, pp. 719–727.

Stone, "A Logic in Memory Computer," IEEE Trans. on Computers, Jan. 1970, pp. 73–78.

Manning, "An Approach to Highly Integrated Computer Maintained Cellular Arrays," IEEE Trans. on Computers, vol. C–26, No. 6, Jun. 1977, pp. 536–552.

Patil et al., "A Programmable Logic Approach for VLSI," IEEE Trans. on Computers, vol. C–28, No. 9, Sep. 1979, pp. 594–601.

Seitz, "Concurrent VLSI Architectures," IEEE Trans. on Computers, vol. C–33, No. 12, Dec. 1984, pp. 1247–1265.

Hsieh et al., "Third Generation Architecture Boosts Speed and Density of Field Programmable Gate Arrays," Proc. of IEEE CICC Conf. May 1990, pp. 31.2.1 to 31.2.7.

Bursky, "Combination RAM/PLD Opens New Application Options," Electronic Design, May 23, 1991, pp. 138–140.

Ling et al., "WASMII: Data Driven Computer on a Virtual Hardware," Proc. of IEEE Field Prog. Custom Computing Machines Conf., Napa, California, Apr. 1993, pp. 33–42.

Casselman, "Virtual Computing and The Virtual Computer," IEEE, Jul. 1993, p. 43.

Quenot et al., "A Reconfigurable Compute Engine for Real–Time Vision Automata Prototyping, " Proc. of IEEE FCCM Conf., Napa, California, Feb. 1994, pp. 91–100.

Plus Logic "FPSL5110 Intelligent Data Buffer" Product Brief, Plus Logic, Inc., San Jose, California, Oct. 1990, pp. 1–6.

Larsson, T, "Programmable Logic Circuits: The Luxury Alternatives are Coming Soon," Elteknik–med–Aktuell Electronik, No. 4, Feb. 25–Mar. 9, 1988, pp. 37–8, (with English abstract).

Intel Preliminary Datasheet, "iFX780: 10ns FLEXlogic FPGA with SRAM Option," Nov. 1993, pp. 2–24 to 2–46.

Quinnell, Richard A., "FPGA Family Offers Speed, Density, On–Chip RAM, and Wide–Decode Logic,"EDN Dec. 6, 1990, pp. 62–63.

Satoh, Hisayasu et al., "A 209K–Transistor ECL Gate Array with RAM," IEEE Jor. of Solid–State Circuit, vol. 24, No. 5, Oct. 1989, pp. 1275–1279.

Ngai, Kai–Kit Tony, "An SRAM–Programmable Field–Reconfigurable Memory," Manuscript Thesis, The University of Toronto Library, Aug. 18, 1994, pp. 1–68.

Reddy, S. et al., "A High Density Embedded Array Programmable Logic Architecture," Proc. of the IEEE 1996 Custom Integrated Circuits conf. (CICC), San Diego, California, May 5–8, 1996, pp. 251–254.

Brown, S. et al., "FPGA and CPLD Architectures: A Tutorial," IEEE Design & Test of computers, vol. 13, No. 2, Jun. 1, 1996, pp. 42–57.

Altera 1996 Data Book, "FLEX 10K Embedded Programmable Logic Family," Jun. 1996, pp. 29–90.

Nelson, Rick, "Embedded Memory Enhances Programmable Logic for Complex, Compact Designs," EDN Electrical Design News, vol. 41, No. 23, Nov. 7, 1996, pp. 91–106.

Altera 1999 Device Data Book, "APEX 20K Programmable Logic Device Family," May 1999, pp. 23–88.

Xilinx Corporation Data Sheet, "Virtex™ 2.5 V Field Programmable Gate Arrays," Jan. 28, 2000, pp. 1–72.

* cited by examiner

HIGH SPEED PROGRAMMABLE ADDRESS DECODER

This application is a division of U.S. patent application Ser. No. 09/494,186, filed Jan. 28, 2000, which claims the benefit of U.S. provisional application No. 60/117,827, filed Jan. 29, 1999, which are incorporated by reference along with all of the other documents cited in this application.

BACKGROUND OF THE INVENTION

The present invention relates to the field of programmable integrated circuits and in particular, to decoder circuitry for an embedded memory of a programmable logic device.

Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, or look-up tables. Many programmable logic integrated circuits also included embedded user-programmable memory or RAM.

There is a continuing desire to provide greater functionality in a programmable logic integrated circuit, but at the same time, provide greater performance. One of the critical speed paths of the programmable logic integrated circuit is the read and write paths of the memory. It is desirable that reading and writing of the memory is a high-speed path. A memory address is decoded to access the appropriate location in the embedded memory. The address decoding delay is part of the read and write delay in accessing the memory.

Therefore, there is a need to provide high performance address decoding techniques and circuitry in order to improve the performance of the integrated circuit.

SUMMARY OF THE INVENTION

The invention provides a high-performance address decoder circuitry techniques. The address decoder is programmable to allow addressing of the memory in different data widths and depths, which is an especially desirable feature for an embedded memory of a programmable logic integrated circuit. The circuitry can be used as column address decoder or row address decoder, or both. In a dual port memory version of the memory, there may be two instances of each of the decoders, one for writing and one for reading.

In an embodiment, the column decoder circuitry of the invention includes two stages. The first stage is an address predecoder. The first stage address predecoder outputs an intermediate decoded address that is input to second stage. The second stage is a decoding circuit and decoder driver. The second stage provides the decoded address bits that are connected to the memory being addressed. A multiplexer control signal generation circuit generates control bits that are input to the first stage. These control bits are based on a number of programmable configuration bits and control the data width selection of the memory. The programmable configuration bits are user programmable.

Memories are used in many types of integrated circuits, including microprocessors, controllers, ASICs, programmable logic devices (PLDs), FPGAs, DRAMs, SRAMs, EPROMs, and many others. More information on PLDs may be found in the 1998 *Altera Data Book,* which is incorporated by reference. Some integrated circuits, such as PLDs, may include memory blocks that have a programmable data width feature.

This means the dimensions of the array of memory cells may be programmably varied. For example a memory block may be arranged as 2K×16, 2K×8, 8K×4, 16K×2, and 32K×1, as well as many other configurations. For a 2K memory block, some configurations include 128×16, 256×8, 512×4, 1024×2, and 2048×1. For a 4K memory block, some configurations include 128×32, 256×16, 512×8, 1024×4, 2048×2, and 4096×1. A circuit of the present invention is a high performance column address decoder. This column address decoder may, for example, be used in Altera's FLEX® 10K, APEX™ 20K, or APEX™ 20KE series of products or APEX20K400 product to address the EABs or ESBs.

In an embodiment, the invention is an integrated circuit including a first stage decoding circuit having a plurality of address bit inputs and generating a plurality of intermediate address bits. A second stage decoding circuit is connected to the intermediate address bits and generates a plurality of decoded address bits. A multiplexer control signal generation circuit generates a control signal for the first stage decoding circuit.

In another embodiment, the invention is a programmable logic integrated circuit including an embedded memory block, where a data width and depth of the embedded memory block are programmably selectable. A column decoder for the embedded memory includes a first stage decoding circuit. The first stage decoding circuit includes a first address input connected to a first inverter, where an output of the first inverter is connected to a first input of a first multiplexer and a second inverter. An output of the second inverter is connected to a second input of the first multiplexer and a second intermediate decoded address line. And an output of the first multiplexer is coupled to a first intermediate decoded address line. A second stage decoding circuit includes a plurality of logic gates having inputs connected to the first and second intermediate decoded address lines, where the second stage decoding circuit generates a first decoded address list, connected to the embedded memory block.

FIG. 6 shows a block diagram of an interpretation of decoder circuitry of the present invention. Address inputs are connected to a first stage decoding circuit. A control logic block generates multiplexer control signals from data width selection bits. The multiplexer control signals are input to the first stage decoding circuit. The first stage decoding circuit outputs an intermediate decoded address, which is input to a second stage decoding circuit and decoder driver. The second stage decoding circuit generates the decoded address.

The decoding circuitry of the present invention provides high performance, and is faster than other decoding techniques. The circuitry is about 24 percent faster than other decoding circuitry in ×1 mode, and about 65 percent faster in the ×16 mode. The present decoding circuitry reduces performance skew among the different data widths. The circuitry also has fewer transistors and fewer wire connections. Thus, the circuitry takes less space as an integrated circuit.

Other objects, features, and advantages of the present invention will become apparent upon consideration of the following detailed description and the accompanying drawings, in which like reference designations represent like features throughout the figures.

DETAILED DESCRIPTION

Figure 1:
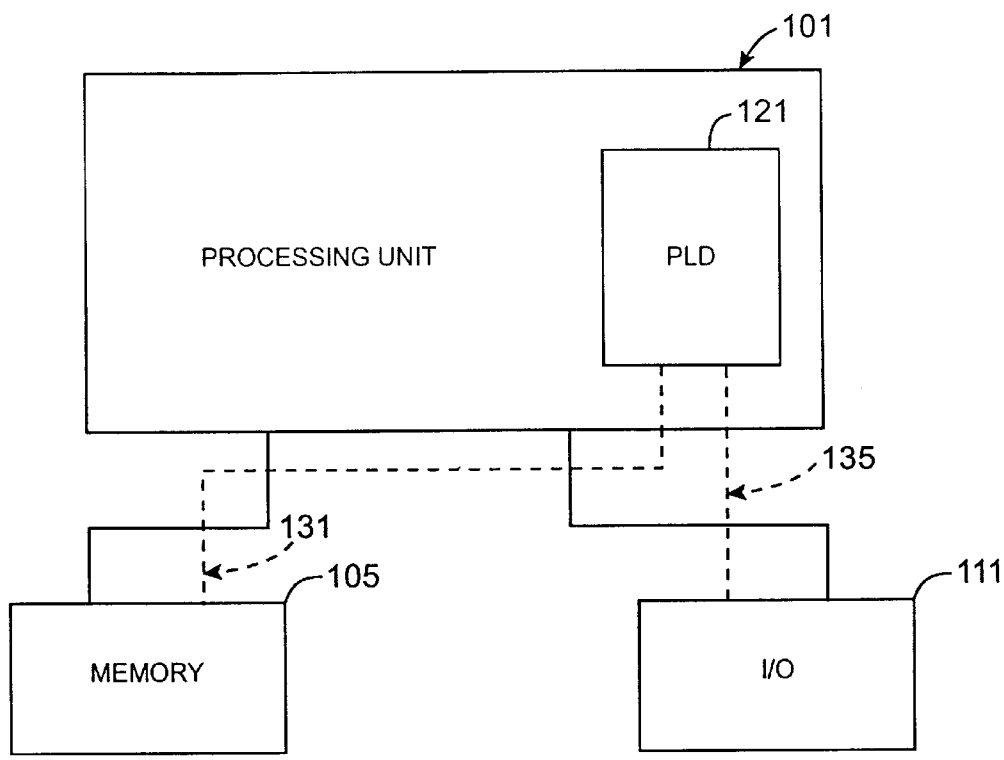
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices are sometimes referred to as a PALs, PLAs, FPLAs, PLDs, CPLDs, EPLDs, EEPLDS, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. No. 4,871,930, 5,241,224, 5,258, 668, 5,260,610, 5,260,611, 5,436,575, and the *Altera Data Book* (1999), all incorporated by reference in their entirety for all purposes. Programmable logic integrated circuits and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
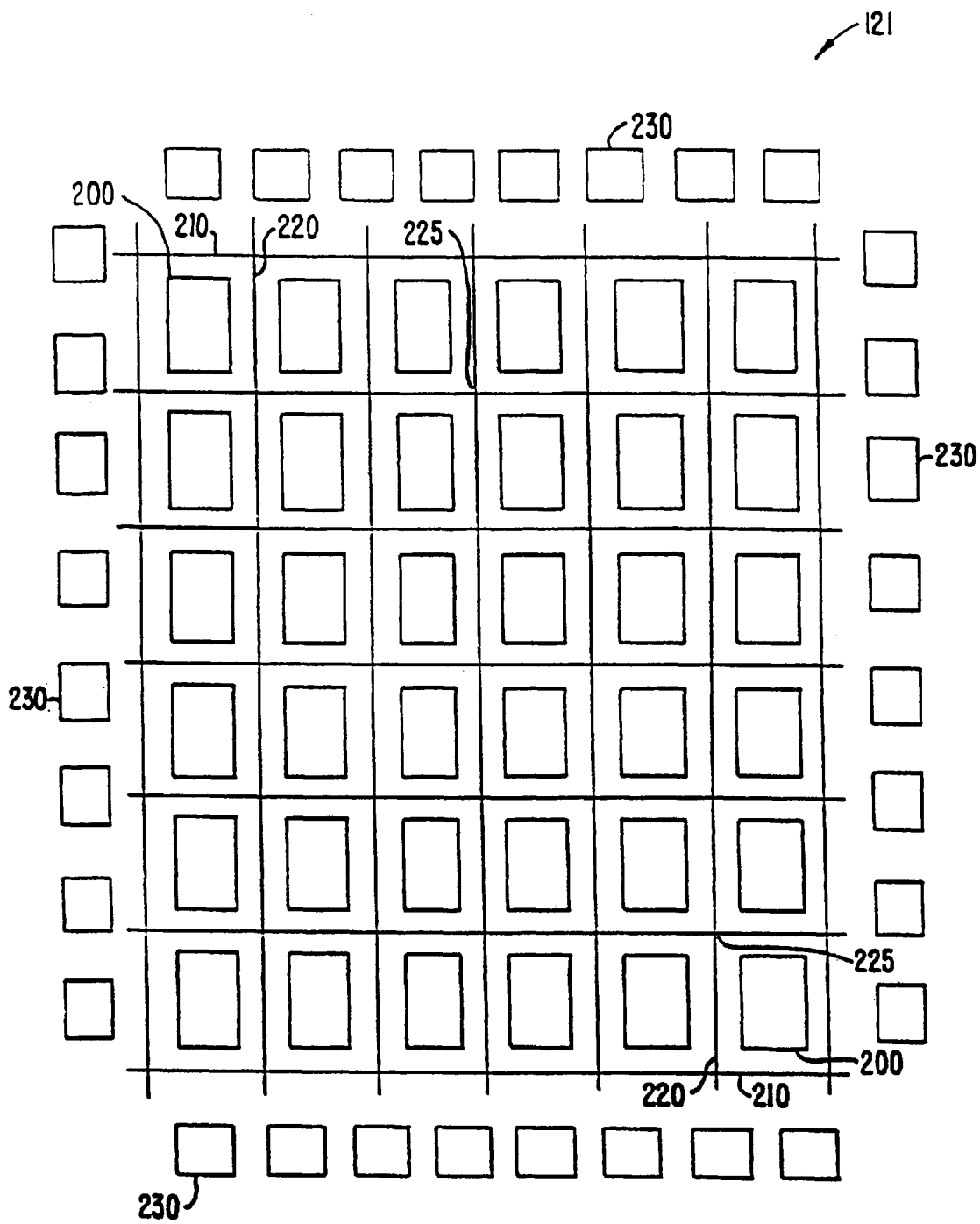
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
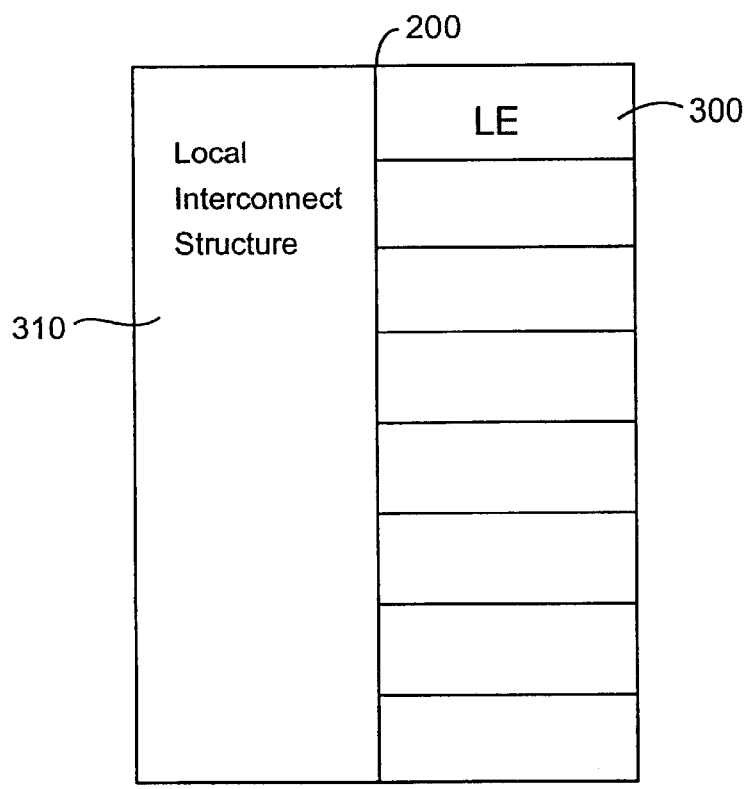
FIG. 3 is a simplified block diagram of a logic array block (LAB)

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
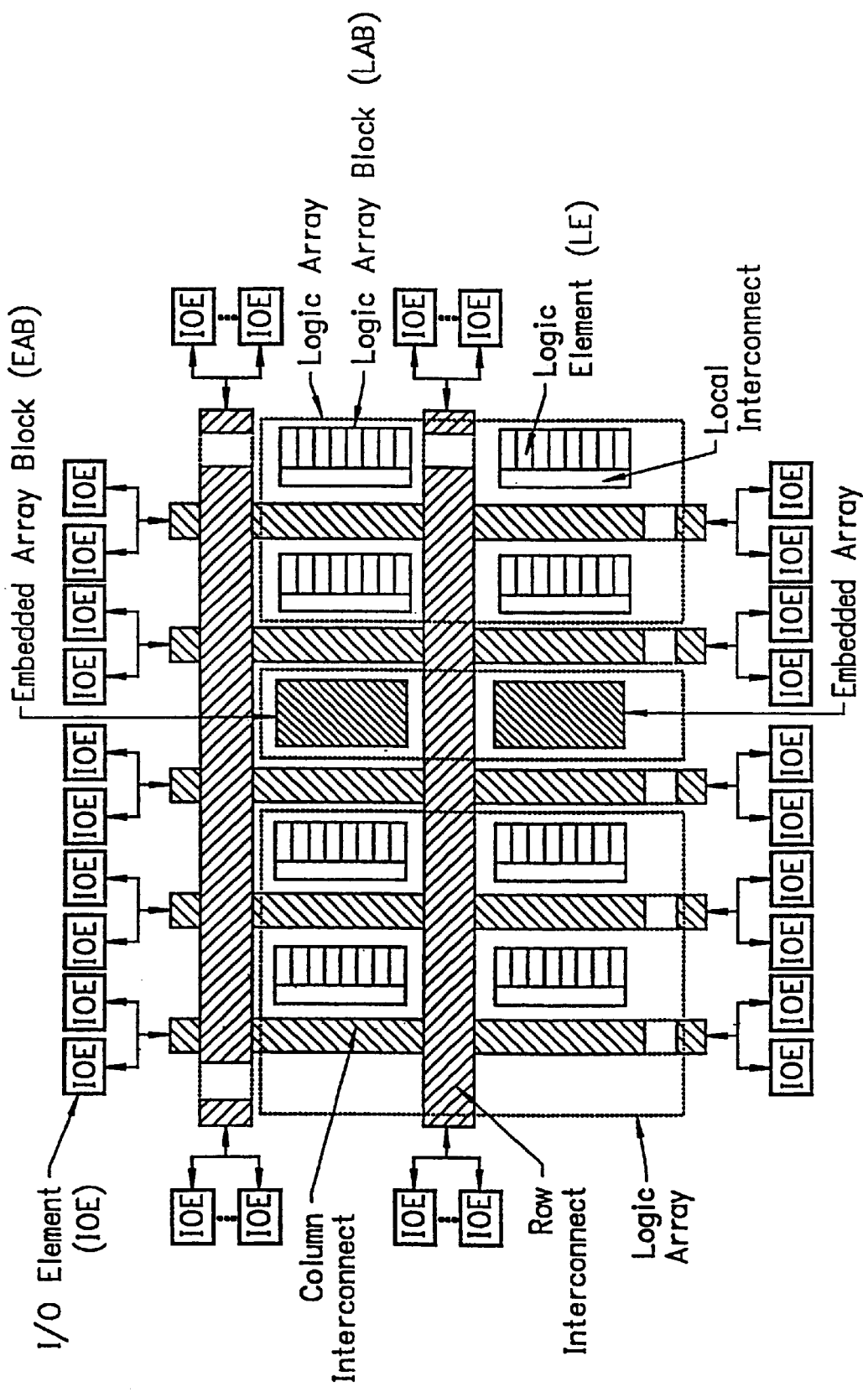
FIG. 4 shows an architecture of a programmable logic integrated circuit with embedded array blocks (EABs)

FIG. 4 shows a PLD architecture similar to that in FIG. 2. The architecture in FIG. 4 further includes embedded array blocks (EABs). EABs contain user memory, a flexible block of RAM. More discussion of this architecture may be found in the *Altera Data Book* (1999) in the description of the FLEX 10K product family and also in U.S. Pat. No. 5,550,782, which are incorporated by reference.

Figure 5:
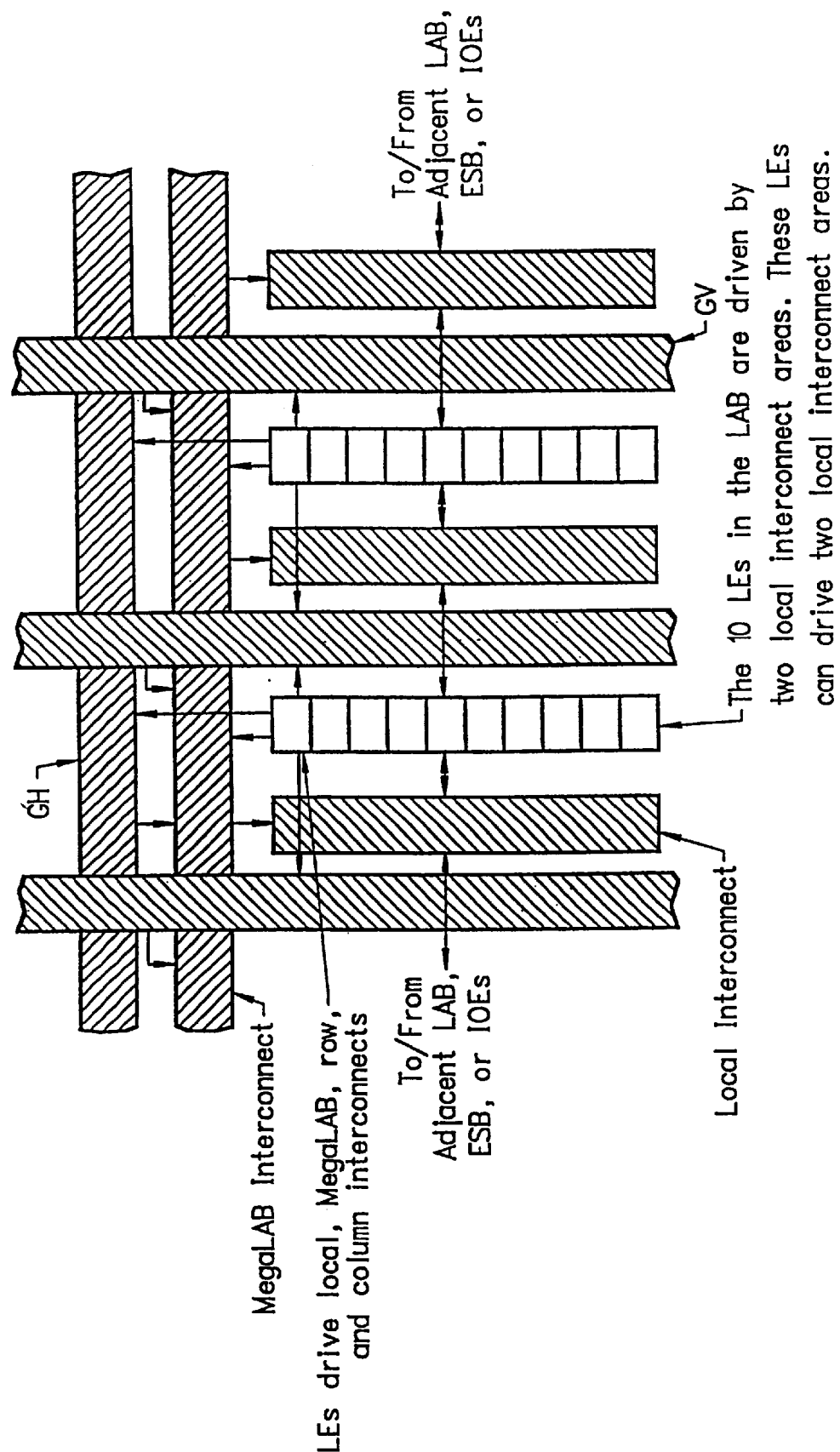
FIG. 5 shows an architecture of a programmable logic integrated circuit with megaLABs.

FIG. 5 shows a further embodiment of a programmable logic integrated circuit architecture. FIG. 5 only shows a portion of the architecture. The features shown in FIG. 5 are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the megaLAB. Compared to the architecture of FIG. 2, this architecture has an additional level of interconnect, the megaLAB interconnect. Such an architecture is found in Altera's APEX™ family of products, which is described in detail in the APEX 20K *Programmably Logic Device Family Data Sheet* (August 1999), which is incorporated by reference. In a specific implementation, a megaLAB also includes an embedded system block (ESB) to implement a variety of memory functions such as CAM, RAM, dual-port RAM, ROM, and FIFO functions.

Figure 6:
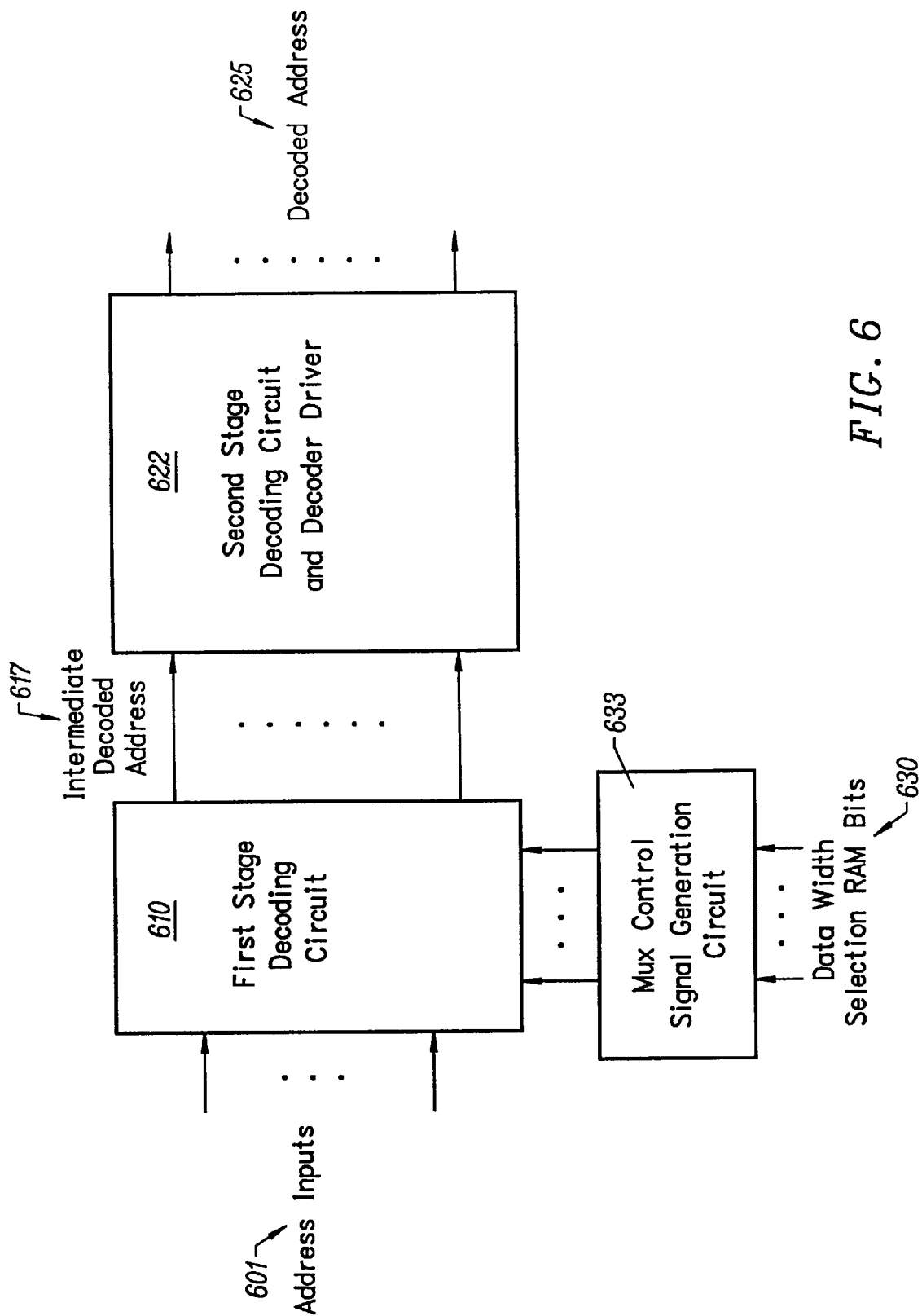
FIG. 6 shows a block diagram of two-stage decoding circuitry for a RAM of a programmable logic device.

FIG. 6 shows a block diagram of two-stage decoding circuitry for a RAM of a programmable logic device. This decoder circuitry can be used for row or column decoding, or both. The ESB or EAB of a programmable logic device may include a RAM with this decoding scheme. This decoding circuitry is high speed and provides the ability to address the RAM in various width and depth configurations. For example, using this decoding circuitry, in a specific embodiment, the RAM may be addressed in a 2K×6, 2K×8, 8K×5, 16K×2, or 32K×1 configurations. There are also many other possible configurations and sizes for the RAM. It is important for the decoding circuitry to have good performance because this circuitry in the critical speed path of the programmable logic device. This decoding circuitry may be used with TTL, CMOS, or low voltage differential signal (LVDS) input buffers.

Although the techniques have been described for RAMs that are 16 bits wide, the circuitry can be easily expanded to permit RAMs having greater than 16 bits. For example, the data width may be 32 bits or 64 bits.

Address inputs 601 are input into a first stage decoding circuit 610. First stage decoding circuit 610 outputs an intermediate decoded address 617, which are input to a second stage decoding circuit 622. Second stage decoding circuit 622 may also include decode driver circuitry, which will drive a decoded address output 625 to the address inputs of the RAM. Data width selection bits 630 are input to a multiplexer control signal generation circuit 633. The multiplexer control signal generation circuit generates control signals input to first stage decoding circuit 610 to control operation. The data width selection bits are used to select a particular width and depth configuration for the RAM. These selection bits may be stored using RAM, SRAM, DRAM, EEPROM, Flash, register, flip-flops, and other types of bit storage. The data width selection bits are typically user-programmable to provide a user-programmable data width selection feature.

Figure 7:
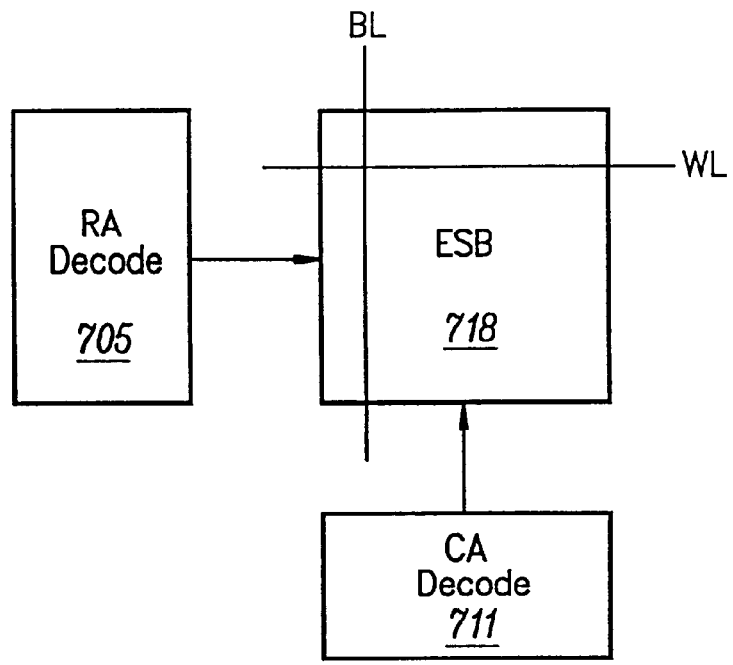
FIG. 7 shows a row address decoder block and column address decoder block interfacing to a RAM.

FIG. 7 shows a row address (RA) decoder block 705 and column address (CA) decoder block 711 interfacing to a RAM 718 (or ESB or EAB). These decoder blocks may use the circuitry described for FIG. 6. The ESB has rows and columns of memory cells. Each of the rows of memory cells is connected to a word line (WL). Each of the columns of the memory cells are connected to a bit line (BL). In a FIFO implementation of a dual-port RAM, where there are separate read and write ports, there will be two RA decoder blocks 705 and two CA decode blocks 711. One RA decoder block is used for reading, and the other is used for writing. Similarly, one CA decoder block is used for reading, and the other is used for writing. In a RAM with more than two ports, there will be additional RA and CA decoder blocks for the additional ports. As discussed above, the user can programmably configure the width and depth of the ESB.

The address decoder circuitry of the invention may also be used for a implementation of a true dual-port RAM, where there are two port and each of these ports can be used for reading or writing.

In a specific implementation, the ESB has 2K memory cells and is arranged in 64 rows by 32 columns. The memory cells may be SRAM cells. There will be 64 read word lines (WLs) and 64 write word lines for a FIFO dual-port ESB. There will be 32 bit lines (BL). In the case of a differentially driven bit lines, there will be 32 BLs and 32/BLs. By decoding or addressing the memory as the user selects, the ESB is addressable in the width and depth configuration desired. For example, for a 2K memory block, some configurations include 128×16, 256×8, 512×4, 1024×2, and 2048×1. For a 4K memory block, some configurations include 128×32, 256×16, 512×8, 1024×4, 2048×2, and 4096×1. The ESB may be constructed to be any desirable size with the appropriate changes. For example, the ESB may be 2K, 3K, 4K, 8K, 16K, 32K, or 64K.

For a true dual-port 2K RAM, there will be 64 WLs for read and write and another separate set of 64 WLs for read and write.

For a 2K×1 configuration, there will be five column address bits and six row address bits. There will one bit for each data input and one bit for each data output. Similarly, for a 128×16, there will be one column address bit and six row address bits. There will be sixteen data input bits and sixteen data output bits.

The address information for the RA and CA decode are provided from one of many different sources. For example, in a programmable logic device, the address may be provided from a pin, LAB, or LE. The address data may be stored in an address register. The source of the address information may be programmable connected to the RA and CA decoder circuit inputs using the programmable interconnect. Also, in a programmable logic device, two or more ESBs may be programmable combined or cascaded to form larger ESBs. Cascaded ESBs or EABs are used to create larger memories where the data width is flexible as in the single ESB case. For example, two 2K ESBs can be cascaded to create one 4K ESBs with the following data width configurations: 128×32, 256×16, 512×8, 1024×4, 2048×2, and 4096×1.

Figure 8:
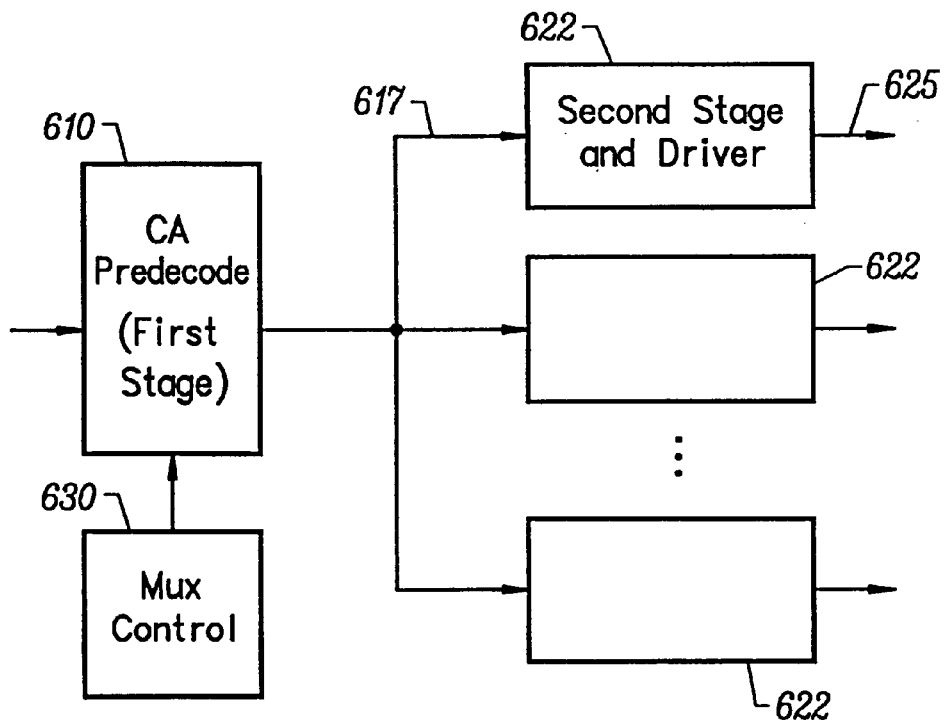
FIG. 8 shows a more detailed diagram of the two-stage decoding scheme.

FIG. 8 shows a more detailed diagram of the two-stage decoding scheme of the invention. The CA predecode or first stage 610 generates intermediate decoded address bits A0 to A9 (for a 64×32 ESB). The intermediate decoded address bits are input to the thirty-two second stage and driver blocks 622. There is one block 622 for each of the columns in the maximum column width configuration permitted by the data width programmable selection. For a data width programmable selection, the RAM or ESB will have 32 unique columns for the x1 width, 16 unique columns for the x2 width, and so forth. For a FIFO implementation of a dual-port RAM, there will two instances of the circuitry of FIG. 8 in an integrated circuit, one instance of the decoder for writing and a second instance for reading.

Figure 9:
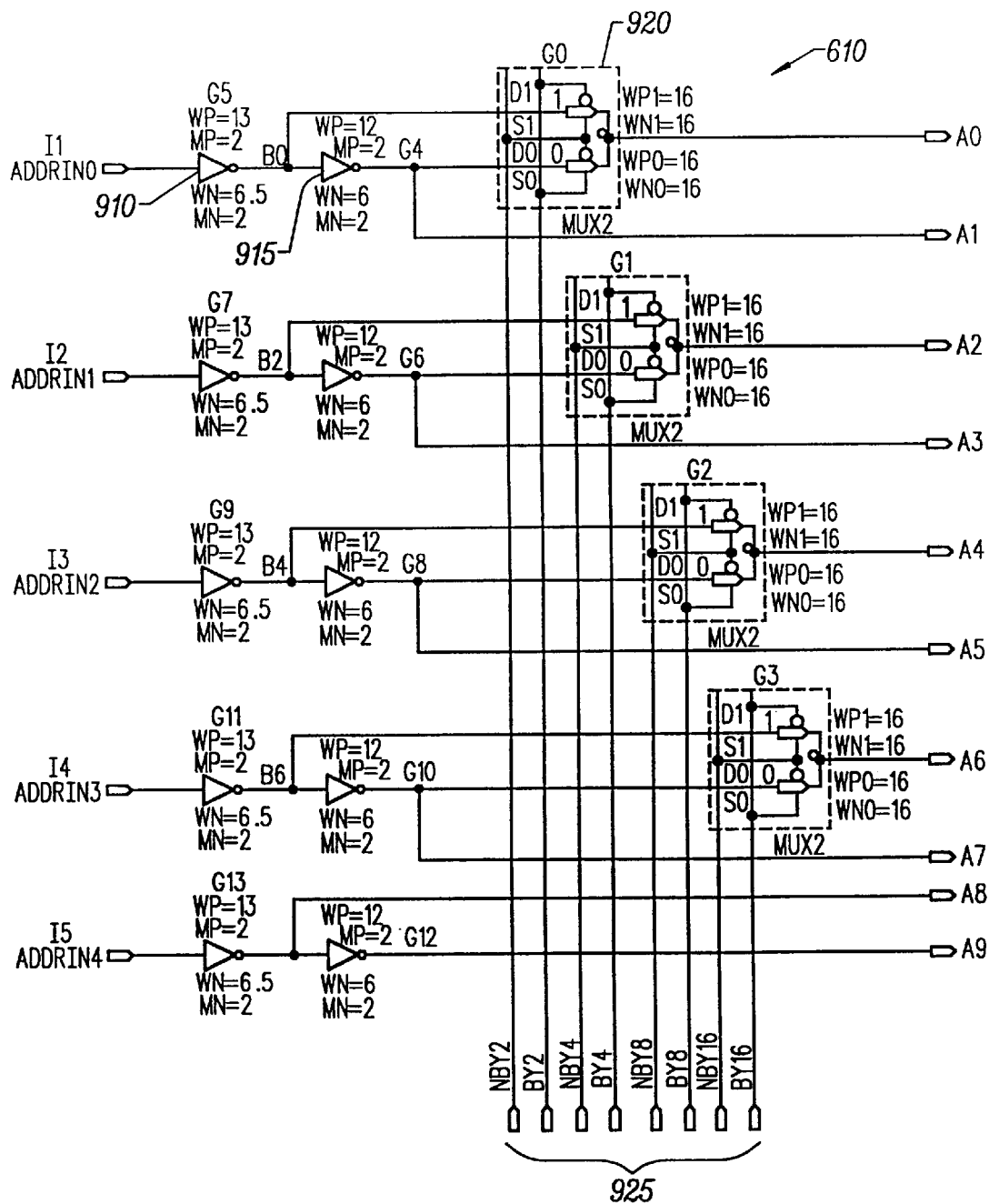
FIG. 9 shows an implementation of the first stage column address predecoder.

FIG. 9 shows an implementation of the first stage column address predecoder 610. This circuitry is for a specific implementation for a 2K RAM, and the circuitry can be changed as appropriate for different sizes of RAM. There are five inputs, I1, I2, I3, I4, and I5. There are ten intermediate decoded address bits, A0, A1, A2, A3, A4, A5, A6, A7, A8, and A9. From the input to the intermediate decoded address bit output, taking I1 as an example, I1 is input through one inverter 910 to generated /I1 and through another inverter 915. /I1 is input to one input of a multiplexer 920 and I1 (from inverter 915) is input to another input of the multiplexer. Control inputs to multiplexer 920 are connected to BY2 and NBY2. BY2 and NBY2 are from data width control bits 925 used to determine the data configuration width of the RAM. Data width control bits 925 are used to determine if the RAM is addressed as x1, x2, x4, x8, or x16. Other inputs I2 through I4 have similar circuitry for the I1 path. For input I5, there is no multiplexer is the path.

In this embodiment, multiplexer 920 is implemented using fully complementary pass gates having both NMOS and PMOS transistors. This allows the intermediate address bit outputs to be full rail signals. In other words, a logic high will be represented by VDD and a logic low will be represented by VSS. Other circuit configurations for a multiplexer may also be used in place of the one shown in FIG. 9. For example, the multiplexer may be implemented using logic gates or NMOS pass gates.

For the circuitry of FIG. 9, table 1 below shows the outputs at A0 to A9 for a given data width configuration.

TABLE 1

| Data Width | A0 | A1 | A2 | A3 | A4 | A5 | A6 | A7 | A8 | A9 |
|---|---|---|---|---|---|---|---|---|---|---|
| X1 | /I1 | I1 | /I2 | I2 | /I3 | I3 | /I4 | I4 | /I5 | I5 |
| X2 | I1 | I1 | /I2 | I2 | /I3 | I3 | /I4 | I4 | /I5 | I5 |
| X4 | I1 | I1 | I2 | I2 | /I3 | I3 | /I4 | I4 | /I5 | I5 |
| X5 | I1 | I1 | I2 | I2 | I3 | I3 | /I4 | I4 | /I5 | I5 |
| X16 | I1 | I1 | I2 | I2 | I3 | I3 | I4 | I4 | /I5 | I5 |

Figure 10:
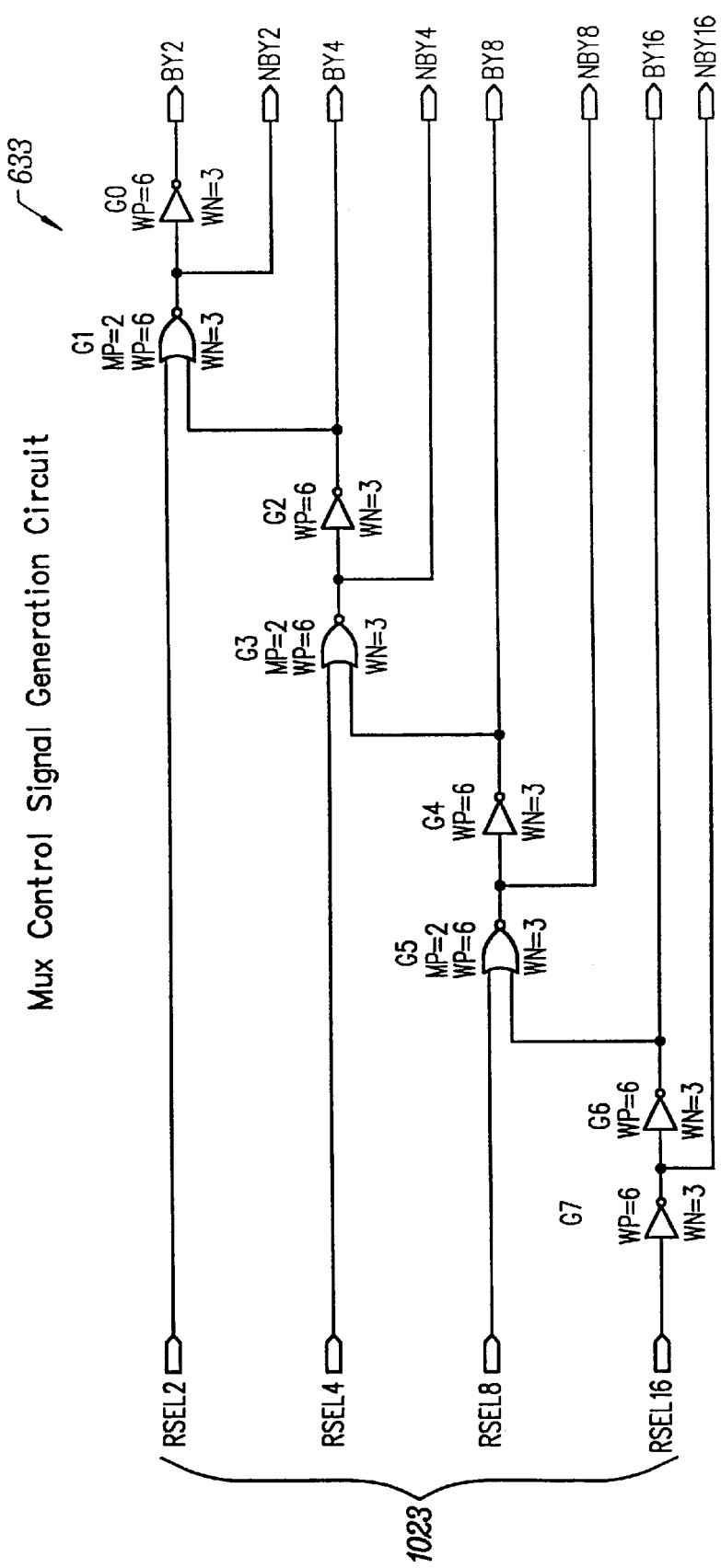
FIG. 10 shows an implementation of a multiplexer control signal control circuit.

FIG. 10 shows an implementation of a multiplexer control signal control circuit 630. Outputs BY2, NBY2, BY4, NBY4, BY8, NBY8, BY16, and NBY16 of the circuitry are the data width control bits that are input to the control lines of the first stage decoding circuit 610. The data width control bits are determines by four programmable bits 1023, which are SRAM, EEPROM, EPROM, or other storage cells that are used to store the user's selection of the data width.

Table 2 shows the programmable bits used to programmable select the appropriate data width configuration.

TABLE 2

| Data Width | RSEL2 | RSEL4 | RSEL8 | RSEL16 |
|---|---|---|---|---|
| X1 | 0 | 0 | 0 | 0 |
| X2 | 1 | 0 | 0 | 0 |
| X4 | 0 | 1 | 0 | 0 |
| X8 | 0 | 0 | 1 | 0 |
| X16 | 0 | 0 | 0 | 1 |

Figure 11:
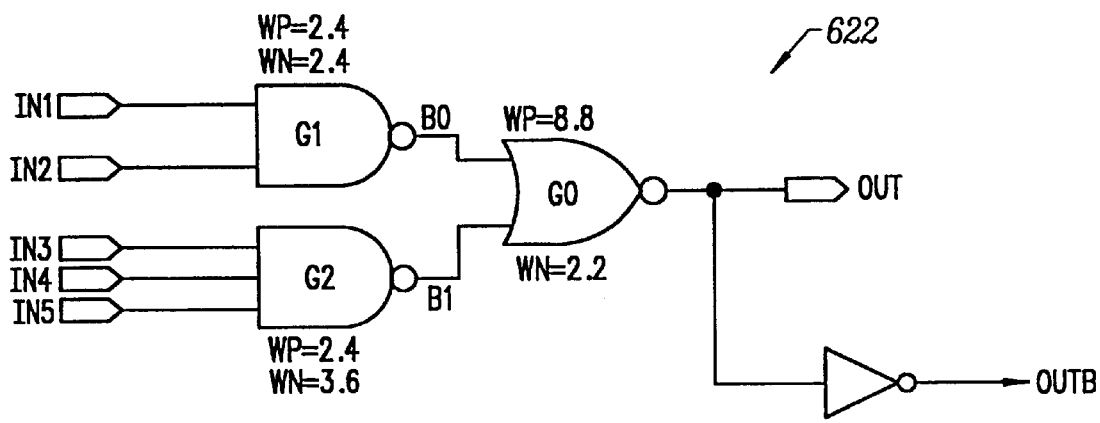
FIG. 11 shows an implementation of a second stage decoding circuit and decoder driver block.

FIG. 11 shows an implementation of a second stage decoding circuit and decoder driver block 622 for FIG. 8. In the FIG. 8 implementation, there would be thirty-two of these circuits. This circuitry takes input from the intermediate decoded address bits as inputs and ANDs these together to generate OUT and OUTB, as needed. In this case, the AND gate is implemented using two NAND gates inputting into a NOR gate. However, there are also many other implementations of an AND gate that can be used.

Tables 3 and 4 show how the intermediate decoded address bits are connected to the inputs of the decoded blocks.

TABLE 3

| Decoder Block | IN1 | IN2 | IN3 | 1N4 | IN5 |
|---|---|---|---|---|---|
| 1 | A0 | A2 | A4 | A6 | A8 |
| 2 | A1 | A2 | A4 | A6 | A8 |
| 3 | A0 | A3 | A4 | A6 | A8 |
| 4 | A1 | A3 | A4 | A6 | A8 |
| 5 | A0 | A2 | A5 | A6 | A8 |
| 6 | A1 | A2 | A5 | A6 | A8 |
| 7 | A0 | A3 | A5 | A6 | A8 |
| 8 | A1 | A3 | A5 | A6 | A8 |
| 9 | A0 | A2 | A4 | A7 | A8 |
| 10 | A1 | A2 | A4 | A7 | A8 |
| 11 | A0 | A3 | A4 | A7 | A8 |
| 12 | A1 | A3 | A4 | A7 | A8 |
| 13 | A0 | A2 | A5 | A7 | A8 |
| 14 | A1 | A2 | A5 | A7 | A8 |

TABLE 3-continued

| Decoder Block | IN1 | IN2 | IN3 | 1N4 | IN5 |
|---|---|---|---|---|---|
| 15 | A0 | A3 | A5 | A7 | A8 |
| 16 | A1 | A3 | A5 | A7 | A8 |

TABLE 4

| Decoder Block | IN1 | IN2 | IN3 | 1N4 | IN5 |
|---|---|---|---|---|---|
| 17 | A0 | A2 | A4 | A6 | A9 |
| 18 | A1 | A2 | A4 | A6 | A9 |
| 19 | A0 | A3 | A4 | A6 | A9 |
| 20 | A1 | A3 | A4 | A6 | A9 |
| 21 | A0 | A2 | A5 | A6 | A9 |
| 22 | A1 | A2 | A5 | A6 | A9 |
| 23 | A0 | A3 | A5 | A6 | A9 |
| 24 | A1 | A3 | A5 | A6 | A9 |
| 25 | A0 | A2 | A4 | A7 | A9 |
| 26 | A1 | A2 | A4 | A7 | A9 |
| 27 | A0 | A3 | A4 | A7 | A9 |
| 28 | A1 | A3 | A4 | A7 | A9 |
| 29 | A0 | A2 | A5 | A7 | A9 |
| 30 | A1 | A2 | A5 | A7 | A9 |
| 31 | A0 | A3 | A5 | A7 | A9 |
| 32 | A1 | A3 | A5 | A7 | A9 |

OUT and OUTB from block 622 are used to select the appropriate bit lines or RAM to read or write data. Similar circuity as described above for the column decode is also used for the row decode to select the appropriate word lines of the ESB or RAM to read or write data.

The decoding circuitry of the present invention provides high performance and is faster than other decoding techniques. The speed path for the decoded has about four and a half gate delays. Note that even when the data width of the RAM increases, the circuitry will have the same performance as a x1 data width. The decoding circuitry also reduce performance skew among the different data widths. There are also fewer transistors and fewer wire connections so the circuitry is compact and takes less integrated circuit area. This detailed description of the invention has been presented for the purpose of illustration and description. It is not intended to be exhaustive or to limit the invention to the precise form described. Many modifications and variations are possible in light of this detailed description. The embodiments were chosen and described in order to best explain the principles of the invention and its practical applications. Others skilled in the art will recognize that various modifications can be made in order to best utilize and practice the invention for a particular application. The scope of the invention is defined by the following claims.

What is claimed is:

1. An integrated circuit comprising:
a first stage decoding circuit having a plurality of address bit inputs and generating a plurality of intermediate address bits;
a second stage decoding circuit coupled to the intermediate address bits and generating a plurality of decoded address bits, coupled to a memory block; and
a multiplexer control signal generation circuit, generating control signals for the first stage decoding circuit which will determine a data width configuration for the memory block.

2. The integrated circuit of claim 1 wherein the first stage decoding circuit comprises:
a first multiplexer circuit wherein an ADDR0 input or an /ADDR0 input is selectively provided to an A0 output;
a second multiplexer circuit wherein an ADDR1 input or an /ADDR1 input is selectively provided to an A2 output;
a third multiplexer circuit wherein an ADDR2 input or an /ADDR2 input is selectively provided to an A4 output; and
a fourth multiplexer circuit wherein an ADDR3 input or an /ADDR3 input is selectively provided to an A6 output.

3. The integrated circuit of claim 2 wherein the ADDR0 input is provided to an A1 output, the ADDR1 input is provided to an A3 output, the ADDR2 input is provided to an A5 output, and the ADDR3 input is provided to an A7 output.

4. The integrated circuit of claim 1 wherein the multiplexer control signal generation circuit comprises:
a first NOR gate circuit that generates first and second control signals for the first stage decoding circuit;
a second NOR gate circuit that generates third and fourth control signals for the first stage decoding circuit; and
a third NOR gate circuit that generates fifth and sixth control signals for the first stage decoding circuit.

5. The integrated circuit of claim 1 wherein the second stage decoding circuit includes a plurality of logic circuits that perform AND logic functions on subsets of the intermediate address bits to generate the plurality of decoded address bits.

6. The integrated circuit of claim 5 wherein the plurality of logic circuits comprise first and second NAND gates coupled to inputs of a NOR gate.

7. The integrated circuit of claim 1 wherein the decoded address bits are used to select appropriate lines in a memory circuit to read data.

8. The integrated circuit of claim 1 wherein the decoded address bits are used to select appropriate lines in a memory circuit to write data.

9. The integrated circuit of claim 1 wherein the second stage decoding circuit is coupled to a RAM of a programmable logic device.

10. A method for decoding a plurality of address input signals to provide a plurality of decoded address output signals to a memory circuit, comprising:
generating a plurality of data width control signals that indicate a data width configuration for the memory circuit;
predecoding the address input signals in response to the data width control signals to generate a plurality of intermediate address signals; and
decoding the intermediate address signals to generate the decoded address output signals.

11. The method of claim 10 further comprising:
selecting appropriate word lines in the memory circuit to read data in response to the decoded address output signals.

12. The method of claim 10 further comprising:
selecting appropriate word lines in the memory circuit to write data in response to the decoded address output signals.

13. The method of claim 10 further comprising:
selecting appropriate bit lines in the memory circuit to read data in response to the decoded address output signals.

14. The method of claim 10 further comprising:
selecting appropriate bit lines in the memory circuit to write data in response to the decoded address output signals.

15. The method of claim 10 wherein predecoding the address input signals in response to the data width control signals to generate the intermediate address signals comprises:

selecting a first address input signal or a complement of the first address input signal in response to a first one of the data width control signals to provide a first intermediate address signal; and selecting a second address input signal or a complement of the second address input signal in response to a second one of the data width control signals to provide a second intermediate address signal.

16. The method of claim 15 wherein predecoding the address input signals in response to the data width control signals to generate the intermediate address signals further comprises:

selecting a third address input signal or a complement of the third address input signal in response to a third one of the data width control signals to provide a third intermediate address signal; and selecting a fourth address input signal or a complement of the fourth address input signal in response to a fourth one of the data width control signals to provide a fourth intermediate address signal.

17. The method of claim 10 wherein decoding the intermediate address signals to generate the decoded address output signals comprises:

performing logical AND functions on subsets of the intermediate address signals to generate the decoded address output signals for the memory circuit.

18. The method of claim 10 wherein decoding the intermediate address signals to generate the decoded address output signals further comprises:

providing the decoded address output signals to RAM circuitry in a programmable logic device.

19. The method of claim 10 wherein generating the data width control signals that indicate the data width configuration for the memory circuit further comprises:

generating the data width control signals in response to a plurality of user-programmable data width selection signals.

20. An integrated circuit comprising:

a first stage decoding circuit comprising a first address input coupled to a first inverter, wherein an output of the first inverter is coupled to a first input of a first multiplexer and a second inverter, an output of the second inverter is coupled to a second input of the first multiplexer and a second intermediate decoded address line, and an output of the first multiplexer is coupled to a first intermediate decoded address line; and a second stage decoding circuit comprising a plurality of logic gates having inputs coupled to the first and second intermediate decoded address lines, wherein the second stage decoding circuit generates decoded address signals and is coupled to a memory circuit.

21. The integrated circuit of claim 20 wherein:

the first stage decoding circuit further comprises a second address input coupled to a third inverter, wherein an output of the third inverter is coupled to a first input of a second multiplexer and a fourth inverter, an output of the fourth inverter is coupled to a second input of the second multiplexer and a fourth intermediate decoded address line, and an output of the second multiplexer is coupled to a third intermediate decoded address line; and wherein the plurality of logic gates in the second stage decoding circuit have inputs coupled to the third and fourth intermediate decoded address lines.

22. The integrated circuit of claim 20 further comprising:

a multiplexer control block that generates a multiplexer control signal coupled to a control input of the first multiplexer, wherein states of the multiplexer control signal are based on programmable configuration bits used to select a data width of the memory circuit.

23. The integrated circuit of claim 22 wherein the data width and depth of the memory circuit is programmably selectable to be 128×16, 256×8, 512×4, 1024×2, and 2048×1.

24. An integrated circuit comprising:

a first stage address decoder comprising at least four predecoded address line outputs, each of the predecoded address line outputs coupled to receive one of four respective address input lines or four corresponding inverted address inputs lines;

a second stage address decoder coupled to the four predecoded address line outputs and generating decoded address lines coupled to an array of memory cells; and a first stage address decoder logic block coupled to the first stage address decoder to control programmable coupling of the four predecoded address lines depending on a selected data width of the array of memory cells.

25. The integrated circuit of claim 24 wherein the second stage address decoder performs AND functions on the predecoded address line outputs to generate the decoded address lines.

26. The integrated circuit of claim 24 wherein:

the first stage address decoder further comprises a plurality of multiplexers which each select one of four respective address input lines or four corresponding inverted address inputs lines as one of the predecoded address line outputs in response to a control signal from the first stage address decoder logic block.

27. An integrated circuit comprising:

a first stage decoding circuit having a plurality of address bit inputs and generating a plurality of intermediate address bits;

a second stage decoding circuit coupled to the intermediate address bits and generating a plurality of decoded address bits; and a multiplexer control signal generation circuit, generating control signals for the first stage decoding circuit, wherein the first stage decoding circuit comprises a first multiplexer circuit wherein an ADDR0 input or an /ADDR0 input is selectively provided to an A0 output, a second multiplexer circuit wherein an ADDR1 input or an /ADDR1 input is selectively provided to an A2 output, a third multiplexer circuit wherein an ADDR2 input or an /ADDR2 input is selectively provided to an A4 output, and a fourth multiplexer circuit wherein an ADDR3 input or an /ADDR3 input is selectively provided to an A6 output.

28. The integrated circuit of claim 27 wherein the ADDR0 input is provided to an A1 output, the ADDR1 input is provided to an A3 output, the ADDR2 input is provided to an A5 output, and the ADDR3 input is provided to an A7 output.

29. An integrated circuit comprising:

a first stage decoding circuit having a plurality of address bit inputs and generating a plurality of intermediate address bits;

a second stage decoding circuit coupled to the intermediate address bits and generating a plurality of decoded address bits; and a multiplexer control signal generation circuit, generating control signals for the first stage decoding circuit, wherein the multiplexer control signal generation circuit comprises a first NOR gate circuit that generates first and second control signals for the first stage decoding circuit, a second NOR gate circuit that generates third and fourth control signals for the first stage decoding circuit, and a third NOR gate circuit that generates fifth and sixth control signals for the first stage decoding circuit.

30. An integrated circuit comprising:

a first stage decoding circuit having a plurality of address bit inputs and generating a plurality of intermediate address bits;

a second stage decoding circuit coupled to the intermediate address bits and generating a plurality of decoded address bits; and a multiplexer control signal generation circuit, generating control signals for the first stage decoding circuit, wherein the second stage decoding circuit includes a plurality of logic circuits that perform AND logic functions on subsets of the intermediate address bits to generate the decoded address bits, and the logic circuits comprise first and second NAND gates coupled to inputs of a NOR gate.

31. An integrated circuit comprising:

a first stage decoding circuit having a plurality of address bit inputs and generating a plurality of intermediate address bits;

a second stage decoding circuit coupled to the intermediate address bits and generating a plurality of decoded address bits; and a multiplexer control signal generation circuit, generating first control signals for the first stage decoding circuit, but not generating second control signals for the second stage decoding circuit.

32. The integrated circuit of claim 31 wherein the first control signals determine a data width configuration for a memory block coupled to the second stage decoding circuit.

33. The integrated circuit of claim 31 wherein the decoded address bits are used to select appropriate lines in a memory circuit to read data.

34. The integrated circuit of claim 31 wherein the decoded address bits are used to select appropriate lines in a memory circuit to write data.

35. A method for decoding a plurality of address input signals to provide a plurality of decoded address output signals to a memory circuit, comprising:

generating a plurality of control signals from a multiplexer circuit;

predecoding the address input signals at a first stage decoding circuit in response to the plurality of control signals to generate a plurality of intermediate address signals; and decoding the intermediate address signals at a second stage decoding circuit to generate the decoded address output signals, wherein the mutliplexer circuit does not provide control signals to the second stage decoding circuit.

36. The method of claim 35 wherein generating the plurality of control signals from the multiplexer circuit further comprises generating a plurality of data width control signals that indicate a data width configuration for the memory circuit.

37. The method of claim 36 wherein generating the plurality of data width control signals that indicate the data width configuration for the memory circuit further comprises:

generating the data width control signals in response to a plurality of user-programmable data width selection signals.

38. The method of claim 35 further comprising selecting appropriate lines in the memory circuit to read data in response to the decoded address output signals.

39. The method of claim 35 further comprising selecting appropriate lines in the memory circuit to write data in response to the decoded address output signals.

\* \* \* \* \*